United States Patent
Lu et al.

(10) Patent No.: US 12,151,337 B2
(45) Date of Patent: Nov. 26, 2024

(54) METHOD FOR POLISHING SINGLE-CRYSTAL DIAMOND

(71) Applicant: Huaqiao University, Fujian (CN)

(72) Inventors: Jing Lu, Fujian (CN); Xipeng Xu, Fujian (CN); Yanhui Wang, Fujian (CN); Qiufa Luo, Fujian (CN); Ping Xiao, Fujian (CN)

(73) Assignee: Huaqiao University, Fujian (CN)

( * ) Notice: Subject to any disclaimer, the term of this patent is extended or adjusted under 35 U.S.C. 154(b) by 462 days.

(21) Appl. No.: 17/728,370

(22) Filed: Apr. 25, 2022

(65) Prior Publication Data

US 2022/0241927 A1   Aug. 4, 2022

Related U.S. Application Data

(63) Continuation of application No. PCT/CN2020/123118, filed on Oct. 23, 2020.

(30) Foreign Application Priority Data

Oct. 23, 2019   (CN) .......................... 201911010813.8

(51) Int. Cl.
  *B24B 37/20* (2012.01)
  *B24B 53/017* (2012.01)
  (Continued)

(52) U.S. Cl.
  CPC ............ *B24B 37/20* (2013.01); *B24B 53/017* (2013.01); *C09G 1/02* (2013.01); *C30B 29/04* (2013.01)

(58) Field of Classification Search
  None
  See application file for complete search history.

(56) References Cited

U.S. PATENT DOCUMENTS

| | | | |
|---|---|---|---|
| 2004/0118051 A1* | 6/2004 | Shiho | B24B 37/24 451/533 |
| 2004/0142638 A1* | 7/2004 | Petroski | B24B 37/24 451/41 |

(Continued)

FOREIGN PATENT DOCUMENTS

| | | |
|---|---|---|
| CN | 1607068 A | 4/2005 |
| CN | 101301735 A | 11/2008 |

(Continued)

OTHER PUBLICATIONS

Jing Lu et al ; precision polishing of single crystal diamond substrate using sol-gel (SG) polishing pad; IEEE Transactions on Semiconductor Manufacturing ( vol. 32, Issue: 3, Aug. 2019); p. 341-345. (Year: 2019).*

(Continued)

*Primary Examiner* — Shamim Ahmed
(74) *Attorney, Agent, or Firm* — Cooper Legal Group, LLC

(57) ABSTRACT

Forming an amorphous carbon layer due to lattice distortion of carbon atoms on a surface layer of a single-crystal diamond under a mechanical shear function of a hard abrasive, and generating a chemical reaction between the amorphous carbon layer on the surface layer and the reactive abrasive to achieve quickly removing carbon atoms on the surface layer of the single-crystal diamond due to a local high temperature between abrasive grains and the single-crystal diamond caused by friction at a high speed.

7 Claims, 7 Drawing Sheets

(51) Int. Cl.
  *C09G 1/02* (2006.01)
  *C30B 29/04* (2006.01)

(56) References Cited

U.S. PATENT DOCUMENTS

2014/0124793 A1* 5/2014 Singh .............. H01L 21/30625
                                                  257/77
2018/0237945 A1   8/2018 Osawa et al.

FOREIGN PATENT DOCUMENTS

| CN | 101500751 | A | 8/2009 |
| CN | 101972979 | A | 2/2011 |
| CN | 103282157 | A | 9/2013 |
| CN | 106103615 | A | 11/2016 |
| CN | 106425825 | A | 2/2017 |
| CN | 110026831 | A | 7/2019 |
| CN | 110774153 | A | 2/2020 |
| JP | 2012035402 | A | 2/2012 |

OTHER PUBLICATIONS

Partial translation of Huaqiao University Master Thesis: Study on Single Crystal Diamond Processing with Sol-gel Polishing Film. (Year: 2017).*
International Search Report and English Translation cited in PCT/CN2020/123118 mailed Feb. 1, 2021, 6 pages.
Written Opinion and English Translation cited in PCT/CN2020/123118 mailed Feb. 1, 2021, 9 pages.
Tong, Ruilong; "2017 Master's Thesis of Huaqiao University"; Study on Single Crystal Diamond Processing with Sol-gel Polishing Film, Dec. 31, 2017 (pp. 9-10, 19, 44-48); 82 pages, with English abstract.
Yingchao Lin, "Surface damage of single-crystal diamond (100) processed based on a sol-gel polishing tool", Diamond & Related Materials, No. 83, Mar. 2018, p. 46-53.
JP Office Action cited in JP Application No. 2021-541738, mailed Oct. 18, 2022, 10 pages.
JP Decision to Grant cited in JP Application No. 2021-541738, mailed Aug. 2, 2023, 6 pages.

* cited by examiner

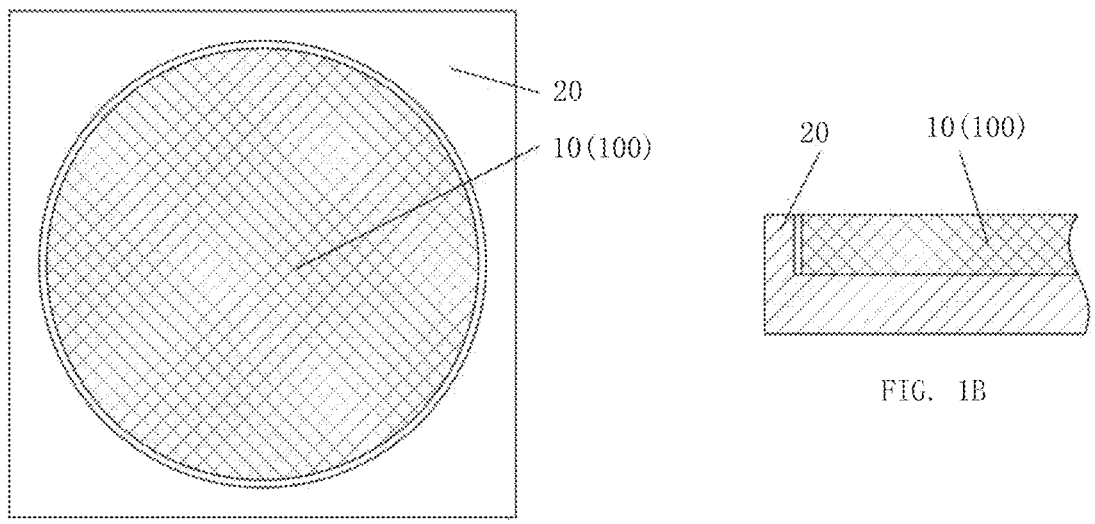
FIG. 1A
FIG. 1B
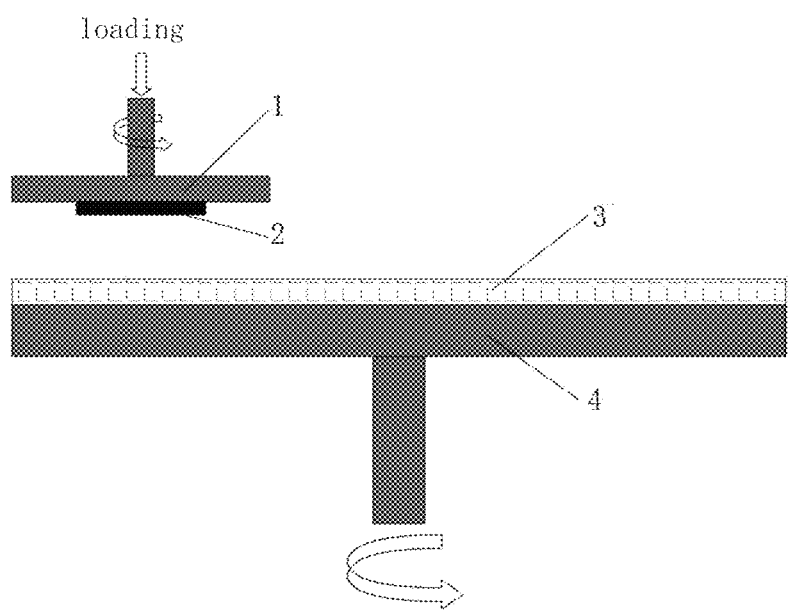
FIG. 2

METHOD FOR POLISHING SINGLE-CRYSTAL DIAMOND

RELATED APPLICATIONS

This application is a continuation of and claims priority to International patent application number PCT/CN2020/123118, filed on Oct. 23, 2020, which claims priority to Chinese patent application number 201911010813.8, filed on Oct. 23, 2019. International patent application number PCT/CN2020/123118 and Chinese patent application number 201911010813.8 are incorporated herein by reference.

FIELD OF THE DISCLOSURE

The present disclosure relates to a technical field of ultra-precision polishing, and in particular relates to a method for polishing a single-crystal diamond.

BACKGROUND OF THE DISCLOSURE

In the 21st century, application prospects of single-crystal diamonds in high-tech fields, especially application prospects of a large-size (e.g., inch-size) single-crystal diamond in semiconductor devices, optical windows, and other fields, has attracted worldwide attention due to the excellent physical and chemical properties of the single-crystal diamond or the large-size single-crystal diamond.

In order to make full use of the diamonds, a polishing of the diamonds is very important. At present, many methods, such as mechanical polishing, chemical mechanical polishing, thermochemical polishing, dynamic friction polishing, etc., have been applied to the polishing of the diamonds. In addition, there are some polishing methods using high energy, such as laser polishing, ion beam polishing, Electrical Discharge Machining (EDM) polishing, etc. Removal mechanisms of existing polishing methods of the diamonds can be divided into the following types: 1. Micro-fragmentation; 2. Graphitization; 3. Oxidation; 4. Evaporation; and 5. Sputtering. One of the polishing methods is often involved in multiple removal mechanisms.

Although there are many existing methods for polishing diamonds, industrial polishing technology is not perfect in some high-end applications, such as, grinding and polishing in semiconductor diamond materials. The polishing technology applied to the semiconductor diamond materials not only requires a flat surface and nano-level roughness, but also needs to minimize and avoid surface damage and subsurface damage. However, traditional polishing methods still have many problems.

Among them, the mechanical polishing is often used for polishing granular diamonds. Although the mechanical polishing can achieve nano-level surface roughness, the mechanical polishing will cause greater damage to the surface and the subsurface of the diamonds. The chemical mechanical polishing has high processing accuracy; however, an efficiency of the chemical mechanical polishing is low, and a large amount of waste liquid is produced. The environment is polluted, and a polishing cost increases. The dynamic friction polishing has a high removal rate of material; however, the dynamic friction polishing can only achieve rough processing of the diamond, and a high polishing pressure in the dynamic friction polishing may cause a film of the diamond to be split. Non-contact polishing, such as the laser polishing or the ion beam polishing, has advantages in processing a thin film and a curved surface; however, a processing range of the non-contact polishing is limited and is not suitable for a processing of the large-size single-crystal diamonds. Plasma etching can effectively remove surface damage and subsurface damage caused by the traditional polishing; however, when the plasma etching is used as a polishing method, an efficiency is extremely low. The EDM polishing must be based on a premise that the diamond is conductive, and EDM polishing is only suitable for rough processing of the diamond.

Therefore, on one hand, the diamond has extremely high hardness and excellent chemical stability, and a processing of the diamond is quite difficult. On the other hand, problems in the polishing of the diamond cannot be solved using the existing methods, and there is no existing method for polishing the large-size single-crystal diamonds.

BRIEF SUMMARY OF THE DISCLOSURE

An objective of the present disclosure is to provide a method for polishing a single-crystal diamond to solve problems of polishing the single-crystal diamonds.

A technical solution of the present disclosure is as follows.

A method for polishing a single-crystal diamond, comprising:
(1) mixing a hard abrasive, a reactive abrasive, and a bonding agent to form a uniform dispersion, wherein mass percentages of the hard abrasive, the reactive abrasive, and the bonding agent are 0.5-10%, 0.5-10%, and 80-99%;
(2) flatly paving a porous flexible substrate in a mold, then adding the uniform dispersion to completely immerse the porous flexible substrate and flow horizontally by a weight to obtain a flexible polishing pad after the bonding agent is completely cured;
(3) polishing the single-crystal diamond for 0.5-5 hours by the flexible polishing pad obtained in step (2) with an assistance of a wetting fluid, wherein a relative linear velocity between the flexible polishing pad and the single-crystal diamond is 40-60 m/s, a pressure between the flexible polishing pad and the single-crystal diamond is 10-500 kPa, and a material removal process of the polishing comprises: forming an amorphous carbon layer due to lattice distortion of carbon atoms on a surface layer of the single-crystal diamond under a mechanical shear function of the hard abrasive, and generating a chemical reaction between the amorphous carbon layer on the surface layer and the reactive abrasive to achieve removal of the carbon atoms on the surface layer of the single-crystal diamond due to a local temperature between abrasive grains and the single-crystal diamond caused by friction.

In a preferred embodiment of the present disclosure, the porous flexible substrate is at least one of a fiber pad substrate, a foamed polyurethane substrate, or cotton filter substrate.

In a preferred embodiment of the present disclosure, the hard abrasive is at least one of a diamond abrasive, cubic boron nitride, or boron carbide.

In a preferred embodiment of the present disclosure, a particle size of the hard abrasive is 0.5 μm-60 μm (i.e., W0.5-W60).

In a preferred embodiment of the present disclosure, the reactive abrasive is at least one of copper oxide, iron oxide, or zinc oxide.

In a preferred embodiment of the present disclosure, a particle size of the reactive abrasive is 0.5 μm-60 μm (i.e., W0.5-W60).

In a preferred embodiment of the present disclosure, the bonding agent comprises at least one of epoxy resin, silica gel, or sodium alginate gel.

In a preferred embodiment of the present disclosure, the wetting fluid is deionized water.

The present disclosure has the following advantages.

1. The present disclosure can achieve ultra-precision polishing of a diamond in high-efficiency, obtain nano-level surface roughness, and will not cause damage to a surface of the diamond.

2. The present disclosure is a flexible polishing method, is suitable for a polishing a thin sheet of a large-size (e.g., inch-size) single-crystal diamond, and does not easily cause the diamond to be split.

3. The present disclosure only needs deionized water for the polishing and will not cause waste liquid and pollution.

BRIEF DESCRIPTION OF THE DRAWINGS

FIG. 1A illustrates a top view of a mold of an embodiment of the present disclosure, and FIG. 1B illustrates a cross-sectional view of a part of the mold of the embodiment of the present disclosure.

FIG. 2 illustrates a structural view of a machine platform of the embodiment of the present disclosure.

DETAILED DESCRIPTION OF THE EMBODIMENTS

The technical solutions of the present disclosure will be further described in combination with the accompanying embodiments and drawings.

Embodiment 1

(1) Deionized water, a cubic boron nitride 51 with a particle size of 40 μm, iron oxide powder 61 with a particle size of 40 μm, and sodium alginate powder 71 (the sodium alginate powder 71 is used to form sodium alginate gel) are added into a beaker in sequence and are stirred for 2 hours by a stirrer to be mixed to form a uniform dispersion. Mass percentages of the deionized water, the cubic boron nitride 51, the iron oxide powder 61, and the sodium alginate powder 71 are 85%, 5%, 5%, and 5% respectively.

Figure 3:
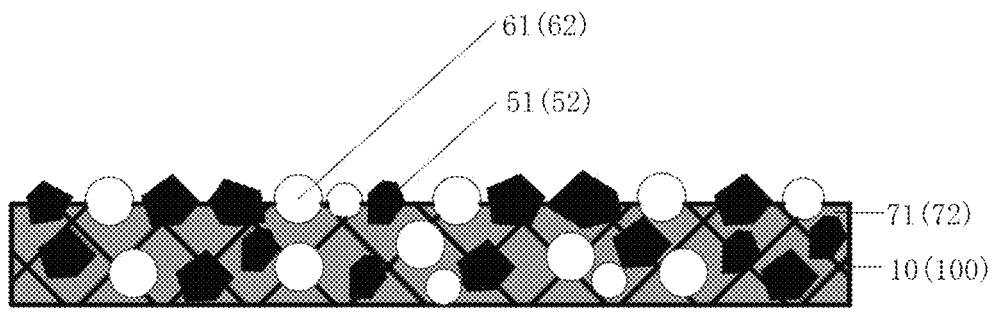
FIG. 3 illustrates a cross-sectional view of a structure of a flexible polishing pad of the present disclosure.
Figure 7:
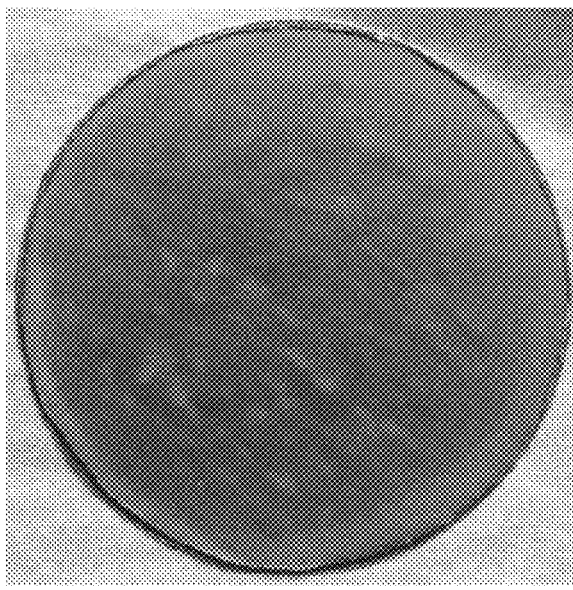
FIG. 7 is a photograph of a flexible polishing pad prepared in Embodiment 1 of the present disclosure.

(2) A circular foamed polyurethane substrate 10 (i.e., a porous polyurethane substrate or a porous flexible substrate) with a diameter of 300 mm and a thickness of 2 mm is paved (e.g., flatly paved) on a mold 20 in FIGS. 1A and 1B, and the uniform dispersion is added to completely submerge the circular foamed polyurethane substrate 10 and flows horizontally to obtain an uncured product due to a weight. The mold 20 is put into a calcium chloride solution with a weight concentration of 4%, so that the uncured product is cured for 2 hours, taken out after curing, and dried in air to obtain a cured product. After the cured product is completely dried, a flexible polishing pad 3 as shown in FIGS. 3 and 7 is obtained.

Figure 4:
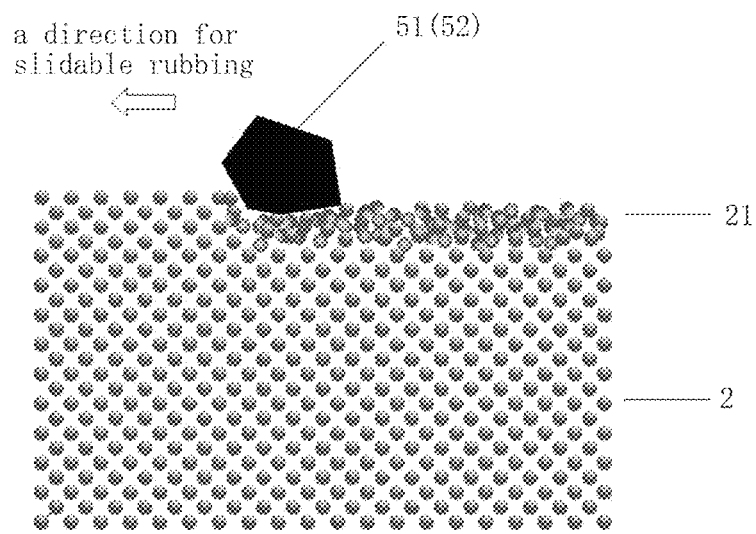
FIG. 4 illustrates a first diagram of a polishing principle of the embodiment of the present disclosure.
Figure 5:
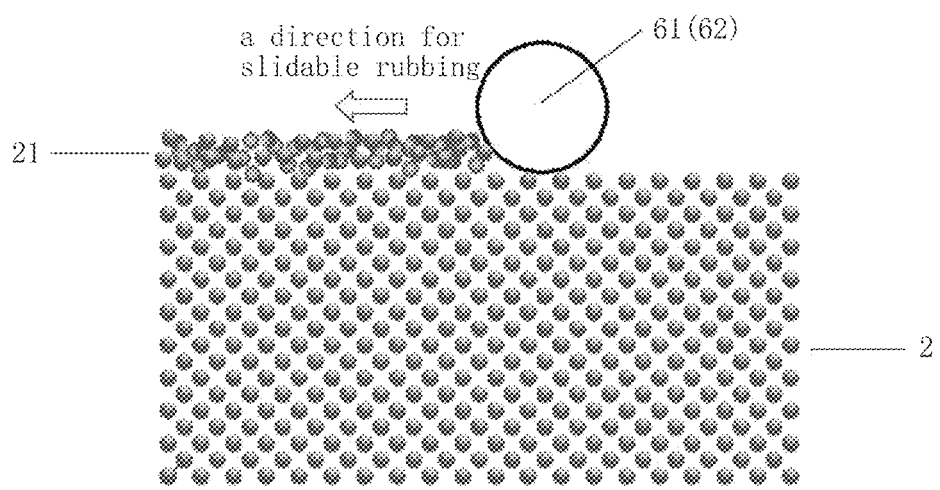
FIG. 5 illustrates a second diagram of the polishing principle of the embodiment of the present disclosure.

(3) The flexible polishing pad 3 obtained in step (2) is installed on a machine platform 4 (e.g., a polishing platform) as shown in FIG. 2, and a large-size (e.g., inch-size) single-crystal diamond 2 (i.e., a single-crystal diamond with a large size) with a diameter of 1 inch is polished for 2 hours with an assistance of deionized water. A relative linear velocity between the flexible polishing pad 3 and the large-size single-crystal diamond 2 is 50 m/s, and a pressure between the flexible polishing pad 3 and the large-size single-crystal diamond 2 is 100 kPa. A material removal process of the polish comprises the following steps: first, the cubic boron nitride 51 and carbon atoms on a surface layer of the large-size single-crystal diamond 2 are squeezed and slidably rubbed due to a mechanical shear movement (e.g., a mechanical shear function of the cubic boron nitride 51), causing lattice distortion of the carbon atoms of the surface layer of the large-size single-crystal diamond 2 to form an amorphous carbon layer 21, as shown in FIG. 4. Second, the cubic boron nitride 51, the iron oxide powder 61, and the surface of the large-size single-crystal diamond 2 generate a local high temperature caused by friction at a high speed, and a chemical reaction between the iron oxide powder 61 and the amorphous carbon layer 21 on the surface of the large-size single-crystal diamond 2 causes the carbon atoms to be quickly removed, as shown in FIG. 5.

Figure 6:
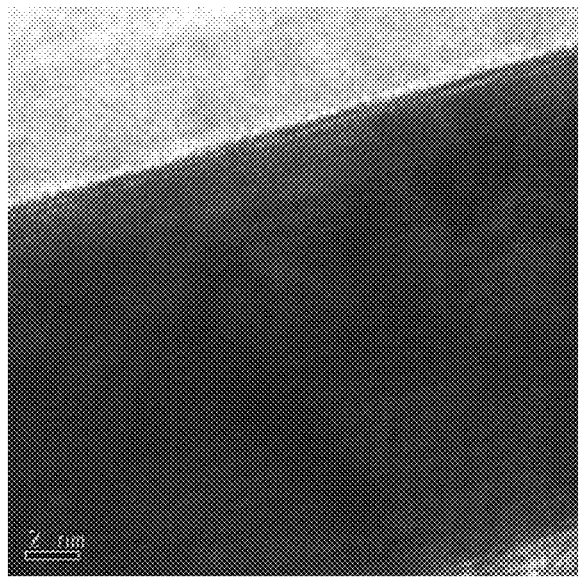
FIG. 6 is a high-resolution transmission electron microscope image of a cross-sectional surface of a subsurface of a single-crystal diamond processed in Embodiment 1 of the present disclosure.
Figure 8:
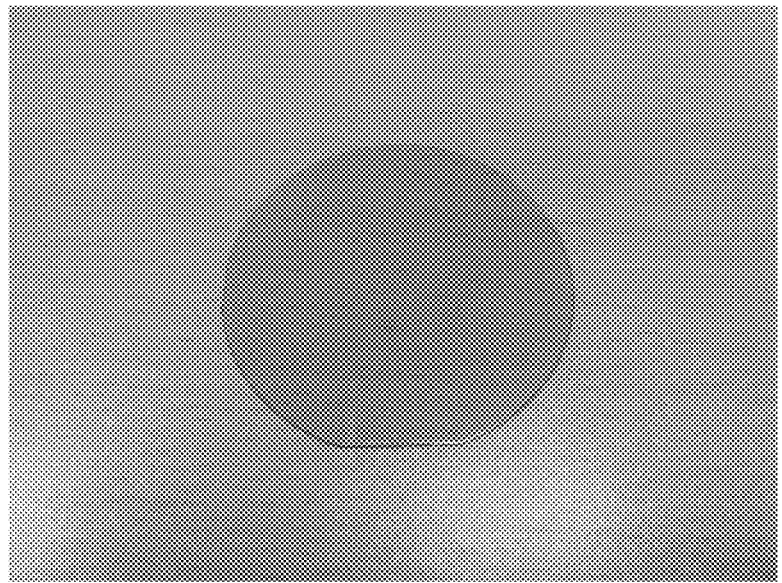
FIG. 8 is a photograph of a chemical vacuum deposition (CVD) single-crystal diamond after polishing in Embodiment 1 of the present disclosure.
Figure 9A:
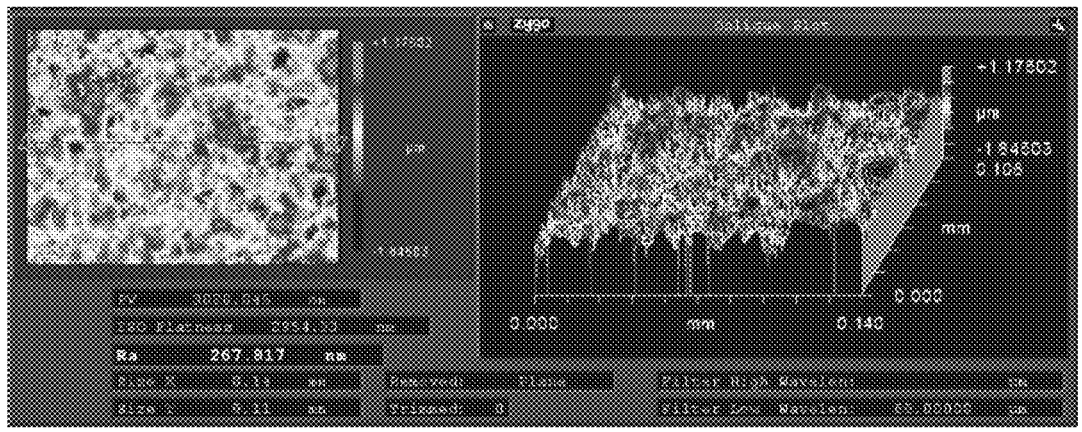
FIG. 9A is a measured drawing of a surface roughness of the single-crystal diamond before polishing in Embodiment 1 of the present disclosure.
Figure 9B:
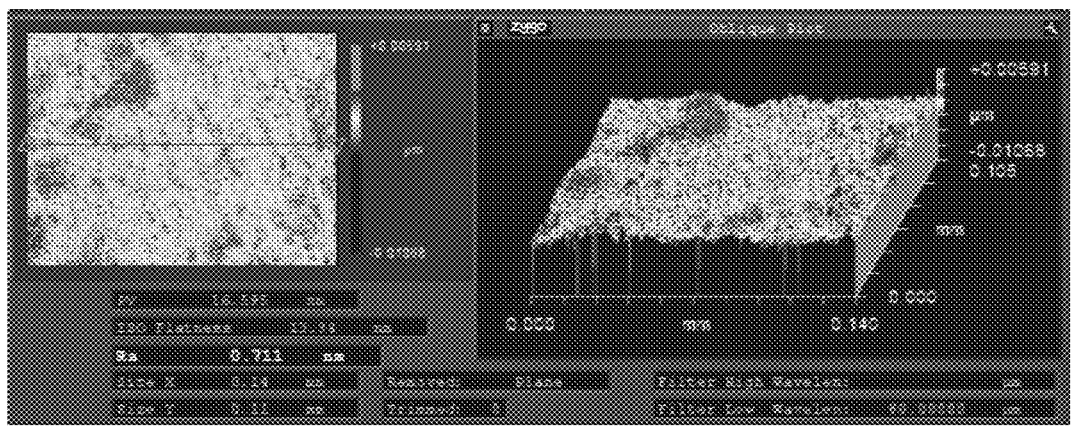
FIG. 9B is a measured drawing of the surface roughness of the single-crystal diamond after polishing in Embodiment 1 of the present disclosure (the surface roughness is measured by a white-light interferometer Zygo 7300).

FIGS. 8 and 6 illustrate high-resolution transmission electron microscope images of the large-size single-crystal diamond 2 after polishing and a cross-sectional surface of a subsurface of the large-size single-crystal diamond 2. A material removal rate in this embodiment is 3 μm/h, an average surface roughness before the polishing is about 270 nm, and an average surface roughness after the polishing is about 0.7 nm. The average surface roughness before the polishing and the average surface roughness after the polishing are shown in FIGS. 9A and 9B.

Embodiment 2

(1) A diamond abrasive 52 with a particle size of 40 µm, copper oxide powder 62 with a particle size of 40 µm, and an epoxy resin composition 72 (the epoxy resin composition 72 comprises a curing agent, a mass ratio of epoxy resin to the curing agent is 2:1) are stirred by a stirrer for 15 minutes to form a uniform dispersion, wherein mass percentages of the diamond abrasive 52, the copper oxide powder 62, and the epoxy resin composition 72 are 5%, 5% and 90% respectively.

Figure 11:
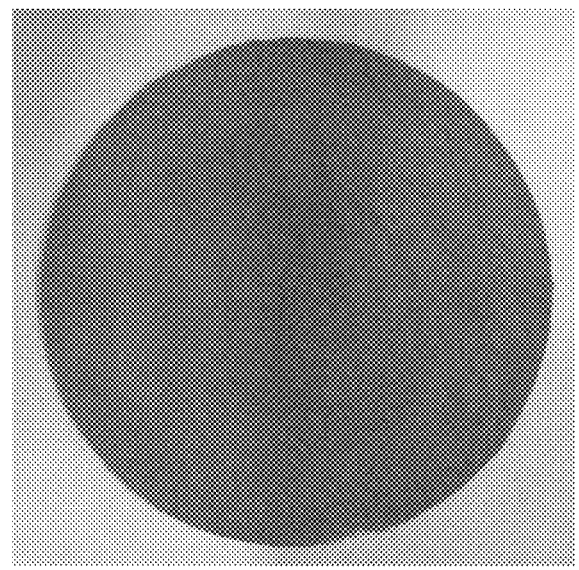
FIG. 11 is a photograph of a flexible polishing pad prepared in Embodiment 2 of the present disclosure.

(2) A circular polymer fiber pad substrate 100 with a diameter of 300 mm and a thickness of 2 mm is paved (e.g., flatly paved) on a mold 20 in FIGS. 1A and 1B, and the uniform dispersion is added to completely submerge the circular polymer fiber pad substrate 100 and flows horizontally to obtain an uncured product due to a weight. After the epoxy resin is completely cured, a flexible polishing pad 3 as shown in FIGS. 3 and 11 is obtained.

(3) The flexible polishing pad 3 obtained in step (2) is installed on a machine platform 4 (e.g., a polishing platform) as shown in FIG. 2, and a large-size (e.g., inch-size) single-crystal diamond 2 (i.e., a single-crystal diamond with a large size) with a diameter of 10 mm×10 mm×1 mm is polished for 1 hour with an assistance of deionized water. A relative linear velocity between the flexible polishing pad 3 and the large-size single-crystal diamond 2 is 40 m/s, and a pressure between the flexible polishing pad 3 and the large-size single-crystal diamond 2 is 200 kPa. A material removal process of the polish comprises the following steps: first, the diamond abrasive 52 and carbon atoms on a surface layer of the large-size single-crystal diamond 2 are squeezed and slidably rubbed due to a mechanical shear movement (e.g., a mechanical shear function of the diamond abrasive 52), causing lattice distortion of the carbon atoms of the surface layer of the large-size single-crystal diamond 2 to form an amorphous carbon layer 21, as shown in FIG. 4. Second, the diamond abrasive 52, the copper oxide powder 62, and the surface of the large-size single-crystal diamond 2 generate a local high temperature caused by friction at a high speed, and a chemical reaction between the copper oxide powder 62 and the amorphous carbon layer 21 on the surface of the large-size single-crystal diamond 2 causes the carbon atoms to be quickly removed, as shown in FIG. 5.

Figure 10:
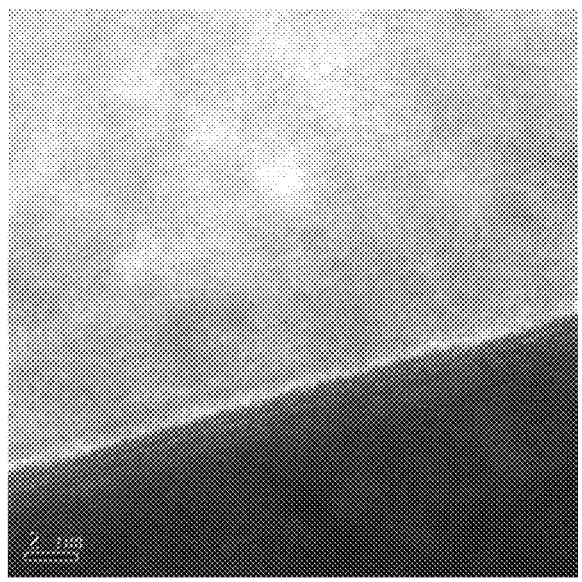
FIG. 10 is a high-resolution transmission electron microscope image of a cross-sectional surface of a subsurface of a single-crystal diamond processed in Embodiment 2 of the present disclosure.
Figure 12:
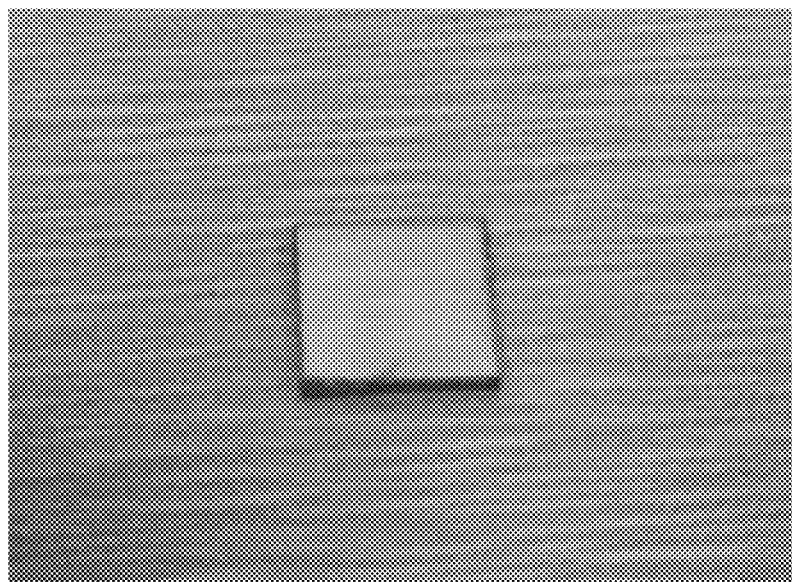
FIG. 12 is a photograph of a CVD single-crystal diamond after polishing in Embodiment 2 of the present disclosure.
Figure 13A:
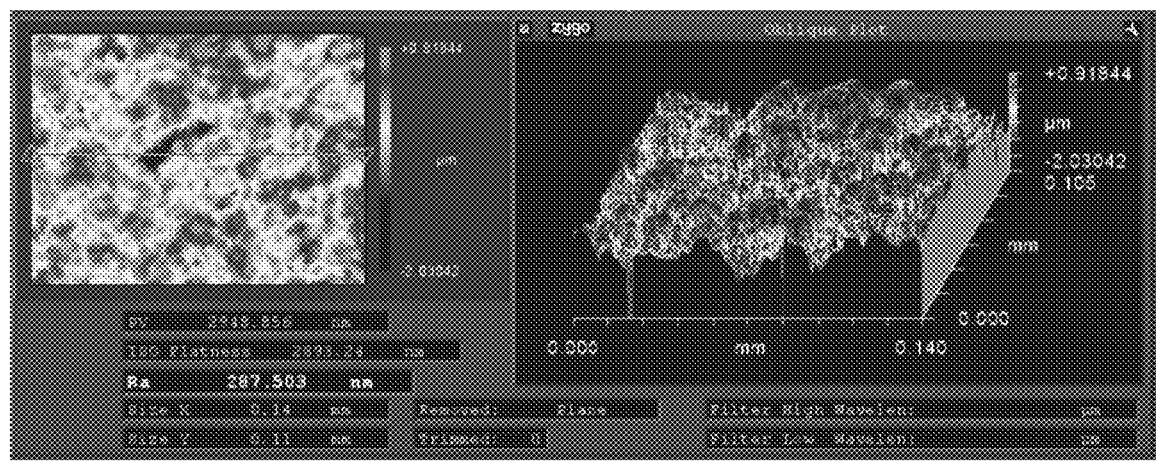
FIG. 13A is a measured drawing of a surface roughness of the single-crystal diamond before polishing in Embodiment 2 of the present disclosure.
Figure 13B:
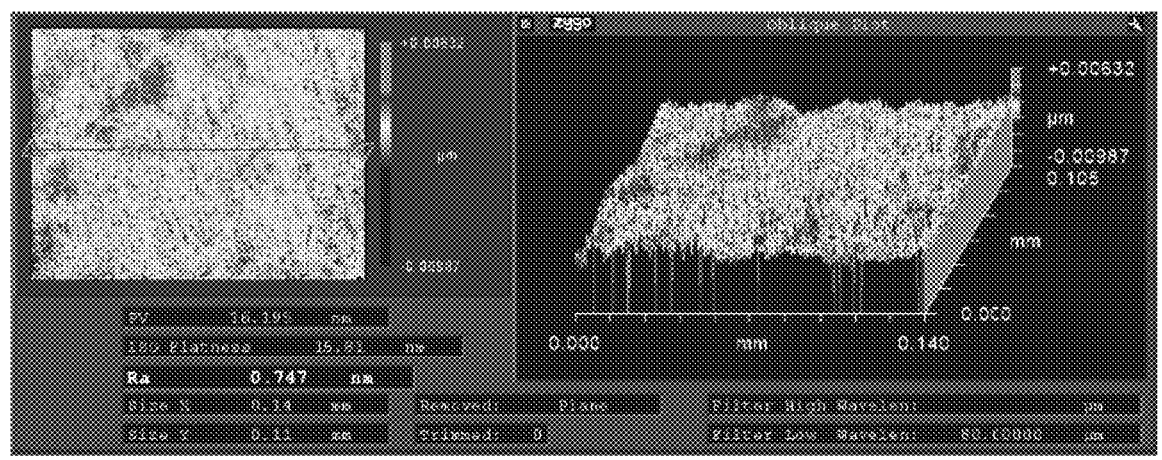
FIG. 13B is a measured drawing of the surface roughness of the single-crystal diamond after polishing in Embodiment 2 of the present disclosure (the surface roughness is measured by the white-light interferometer Zygo 7300).

FIGS. 10 and 12 illustrate high-resolution transmission electron microscope images of the large-size single-crystal diamond 2 after polishing and a cross-sectional surface of a subsurface of the large-size single-crystal diamond 2. A material removal rate in this embodiment is 5 µm/h, an average surface roughness before the polishing is about 280 nm, and an average surface roughness after the polishing is about 0.7 nm. The average surface roughness before the polishing and the average surface roughness after the polishing are shown in FIGS. 13A and 13B.

Comparative Embodiment 1

Figure 14:
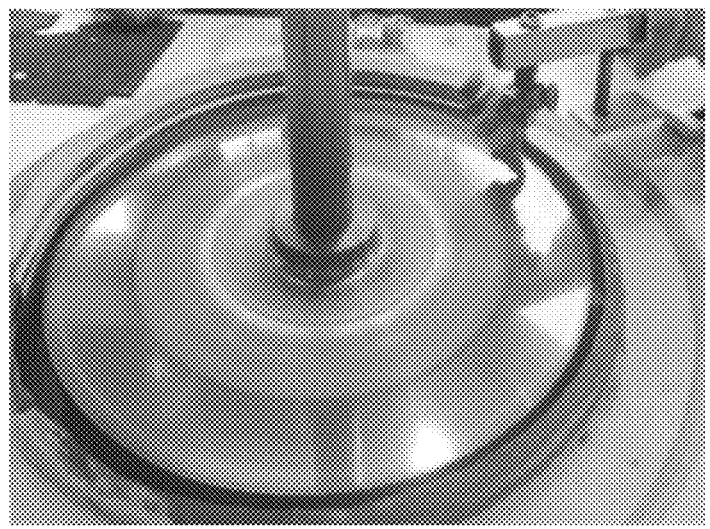
FIG. 14 is a photograph of a mechanical polishing device of Comparative Embodiment 1 of the present disclosure.

At present, mechanical polishing is a conventional method for polishing a single-crystal diamond. The single-crystal diamond is fixed by a mechanical clip and is pressed on a cast iron disk at a high revolution speed for polishing. A surface of the cast iron disk comprises a radial groove or a pore for receiving diamond abrasives. Therein, particle sizes of the diamond abrasives are usually no more than 40 µm, a revolution speed of the cast iron disk is about 2500-3000 rpm (a contact linear velocity between the single-crystal diamond and the cast iron disk is about 30-50 m/s), and a contact pressure between the single-crystal diamond and the cast iron disk generally exceeds 10 N. A typical polishing device is shown in FIG. 14.

Figure 15:
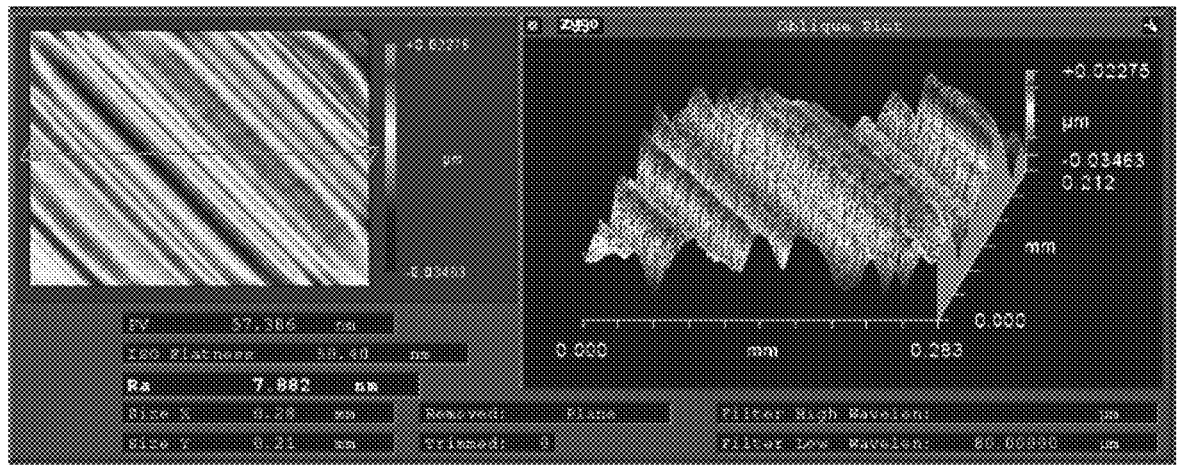
FIG. 15 is a surface morphology of a single-crystal diamond after mechanical polishing in Comparative Embodiment 1 of the present disclosure (the surface morphology is measured by the white-light interferometer Zygo 7300).

When the mechanical polishing is used, an efficiency is high, and the single-crystal diamond can be polished to a nanometer-level surface roughness. However, a polishing surface of the single-crystal diamond will cause micron-level damage due to the mechanical polishing, and the polished surface will show nano-level grooves, as shown in FIG. 15. These are unfavorable to applications in semiconductor fields, optical fields, etc. On the other hand, a size of a chemical vacuum deposition (CVD) single-crystal diamond mechanically polished is small, and the single-crystal diamond in a future application trends to have a large area and a thin thickness. This means that if a diamond sheet with a large size is processed by the mechanical polishing, high contact pressure and high revolution speed may cause a large-size single-crystal diamond to be split. Therefore, the mechanical polishing is not adaptable for processing the large-size single-crystal diamond sheet in the future.

The aforementioned embodiments are merely some embodiments of the present disclosure, and the scope of the disclosure is not limited thereto. Thus, it is intended that the present disclosure cover any modifications and variations of the presently presented embodiments provided they are made without departing from the appended claims and the specification of the present disclosure.

What is claimed is:

1. A method for polishing a single-crystal diamond, comprising:
   (1) mixing a hard abrasive, a reactive abrasive, and a bonding agent to form a uniform dispersion, wherein mass percentages of the hard abrasive, the reactive abrasive, and the bonding agent are 0.5-10%, 0.5-10%, and 80-99% respectively;
   (2) flatly paving a porous flexible substrate in a mold, then adding the uniform dispersion to completely immerse the porous flexible substrate and flow horizontally by a weight to obtain a flexible polishing pad after the bonding agent is completely cured; and
   (3) polishing the single-crystal diamond for 0.5-5 hours by the flexible polishing pad obtained in step (2) with an assistance of a wetting fluid, wherein a relative linear velocity between the flexible polishing pad and the single-crystal diamond is 40 m/s-60 m/s, a pressure between the flexible polishing pad and the single-crystal diamond is 10 kPa-500 kPa, and a material removal process of the polishing comprises:
      forming an amorphous carbon layer due to lattice distortion of carbon atoms on a surface layer of the single-crystal diamond under a mechanical shear function of the hard abrasive, and
      generating a chemical reaction between the amorphous carbon layer on the surface layer and the reactive abrasive to achieve removal of the carbon atoms on the surface layer of the single-crystal diamond due to a local temperature between abrasive grains and the single-crystal diamond caused by friction, wherein the reactive abrasive is at least one of copper oxide, iron oxide, or zinc oxide.

2. The method according to claim 1, wherein the porous flexible substrate is at least one of a fiber pad substrate, a foamed polyurethane substrate, or cotton filter substrate.

3. The method according to claim 1, wherein the hard abrasive is at least one of a diamond abrasive, cubic boron nitride, or boron carbide.

4. The method according to claim 3, wherein a particle size of the hard abrasive is 0.5 μm-60 μm.

5. The method of claim 1, wherein a particle size of the reactive abrasive is 0.5 μm-60 μm.

6. The method according to claim 1, wherein the bonding agent comprises at least one of epoxy resin, silica gel, or sodium alginate gel.

7. The method of claim 1, wherein the wetting fluid is deionized water.

* * * * *